(12) United States Patent
Chalasani et al.

(10) Patent No.: US 10,791,203 B2
(45) Date of Patent: Sep. 29, 2020

(54) MULTI-PROTOCOL RECEIVER

(71) Applicant: Synopsys, Inc., Mountain View, CA (US)

(72) Inventors: Prasad Chalasani, San Jose, CA (US); Venkata N. S. N. Rao, Fremont, CA (US); Majid Jalali Far, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 22 days.

(21) Appl. No.: 15/795,144

(22) Filed: Oct. 26, 2017

(65) Prior Publication Data

US 2019/0132428 A1 May 2, 2019

(51) Int. Cl.
*H04L 29/06* (2006.01)
*H03F 3/45* (2006.01)
*H04L 25/02* (2006.01)

(52) U.S. Cl.
CPC ......... *H04L 69/18* (2013.01); *H03F 3/45183* (2013.01); *H03F 3/45219* (2013.01); *H04L 25/0272* (2013.01); *H03F 2203/45074* (2013.01); *H03F 2203/45081* (2013.01)

(58) Field of Classification Search
None
See application file for complete search history.

(56) References Cited

U.S. PATENT DOCUMENTS

| | | | |
|---|---|---|---|
| 6,028,454 A | 2/2000 | Elmasry et al. | |
| 6,236,242 B1 | 5/2001 | Hedberg | |
| 6,507,888 B2 | 1/2003 | Wu et al. | |
| 6,690,207 B1* | 2/2004 | Smetana | H03K 19/001 326/115 |
| 7,196,551 B2 | 3/2007 | Lee | |
| 7,321,239 B2 | 1/2008 | Hedberg | |
| 2004/0247036 A1* | 12/2004 | Hedberg | H03K 19/00323 375/257 |
| 2005/0264321 A1* | 12/2005 | Lee | H03K 19/018528 326/115 |

* cited by examiner

*Primary Examiner* — Chi H Pham
*Assistant Examiner* — Raul Rivas
(74) *Attorney, Agent, or Firm* — Fenwick & West LLP (57) ABSTRACT

A multi-protocol receiver for receiving at least one input signal comprises: a comparator, a protection controller, and a multi-stage current mode logic ("CML") buffer. The comparator compares a reference voltage and a predefined voltage. At least one output of the comparator is coupled to at least one input of the protection controller. The multi-stage current mode logic buffer receives the input signal and the reference voltage. Outputs of the protection controller are coupled to control inputs of the multi-stage CML buffer for operating the multi-stage CML buffer to process the input signal and the reference signal.

19 Claims, 6 Drawing Sheets

MULTI-PROTOCOL RECEIVER

FIELD OF INVENTION

The disclosure generally relates to a multi-protocol receiver architecture, and more particularly to a signal receiver that can be used with various protocols for double-ended line sensing and single-ended line sensing.

BACKGROUND

Figure 1A:
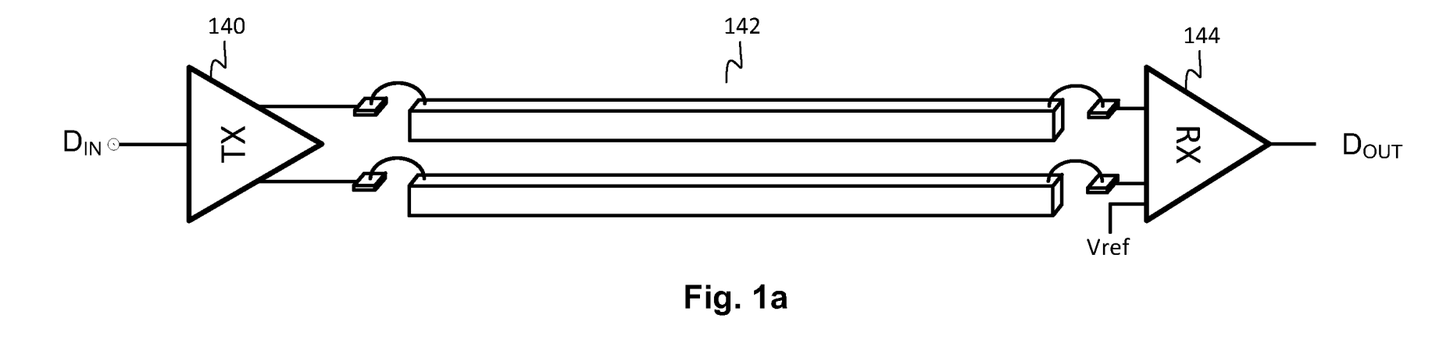
FIGS. 1a-1b illustrate a diagram of transmitters transmitting over singled ended and double ended transmission channels to respective receivers.
Figure 1B:
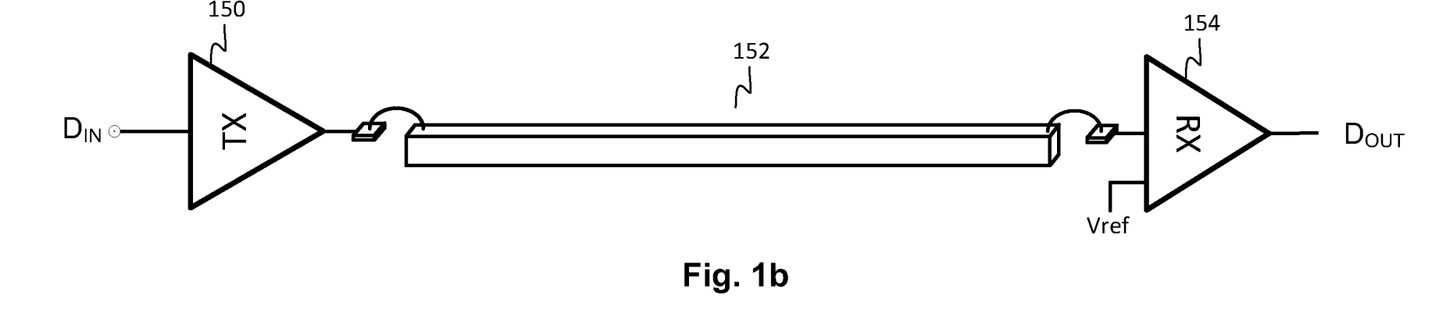

Differential and single-ended double data rate ("DDR") memory interfaces are capable of a transfer data rate of about double the data rate of a standard single data rate synchronous dynamic random-access memory ("SDRAM"). A common DDR transceiver architecture is composed of a transmitter and a receiver, as shown in FIGS. 1a-1b. Referring to FIG. 1a, a transmitter TX 140 transmits data Din differentially over a channel 142 having two lines. A receiver Rx 144 receives differential signals over the two lines and transmits the received data as Dout. It can be appreciated that a reference voltage can be generated at the receiver side or otherwise inputted to the receiver based on a protocol being used for the DDR memory interface. Typically, the reference voltage is generated locally at the receiver side. The reference voltage value can depend upon the protocol applied, e.g., whether the protocol is DDR3, DDR4, etc.

Referring to FIG. 1b, a transmitter TX 150 transmits data Din over a channel 152 having a single line. A receiver Rx 154 receives that signal over the line and transmits the received data as Dout. A reference voltage can be generated at the receiver side or otherwise inputted to the receiver based on a protocol being used for the DDR memory interface. As mentioned, the reference voltage value can depend upon the protocol applied, e.g., whether the protocol is DDR3, DDR4, etc.

Thus, a transmitter can drive data through the channel to a receiver, where the channel can have a single line or differential lines. The use of differential signaling provides for higher data rates compared to the single-ended signaling due to higher immunity to degraded noise and cross talk. However, single-ended signaling provides lower pin cost since it has a double data rate transmission per pin (as opposed to requiring two pins as in differential signaling).

In current applications, singled-ended signaling and double ended signaling are both used as possible protocols for DDR transceivers (and in other receiver applications as well). A well-designed receiver should be compatible with both single ended line transmissions and differential line transmissions. Therefore, it is desirable to provide new methods and apparatuses for a receiver that can support both differential signaling and single-ended signaling for use in various protocols.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein. It is appreciated that the terms such as "first", "second", "third", etc. are used to distinguish between elements such terms describe. These terms are not necessarily intended to indicate temporal or prioritization of such elements.

Also, it is important to note that the term, a signal, may be written in the singular form, but it is appreciated that the signal can be mean a pair of differential signals as well. Therefore, it is appreciated that any mention of a signal in a singular form can be meant to include a plural form of signals, e.g., in relation to differential signals. Likewise, the use of the plural form of signals can also be meant to include the singular form, signal, since the present disclosure can be implemented to handle single-ended signals and double-ended signals.

In an embodiment, a multi-protocol receiver architecture is proposed that can support both differential and single-ended signaling for various protocols. For instance, in a double data rate memory interface application, a DDR receiver can cover a wide DC common mode voltage (e.g., rail-to-rail input). A reference voltage Vref can be compared to a programable voltage to determine how to handle the incoming signal(s) to the receiver. The reference voltage Vref can be an input reference DC voltage that is provided based on the intended transmission protocol.

A protection controller of the receiver can select one or more of the stages of the multi-stage CML buffer to handle the inputted signal(s) to the receiver. For instance, a first stage of the of the multi-stage CML buffer can be used for processing a high DC common mode voltage. A second stage of the multi-stage CML buffer can be used for processing a low DC common mode voltage. The multi-stage CML buffer can also have various transistors of different feature sizes to reduce gate bias stress effect. Furthermore, the reference voltage Vref can be used to determine whether a DC common mode voltage is high or low by determining whether the reference voltage is greater, equal, or less than a predefined voltage. The predefined voltage can be a programmed voltage that is adjustable based on the design of the receiver and the protocols to be received.

In an embodiment, a multi-protocol receiver for receiving at least one input signal comprises: a comparator for comparing a reference voltage and a predefined voltage; a protection controller, where at least one output of the comparator is coupled to at least one input of the protection controller; and a multi-stage current mode logic ("CML") buffer for receiving the input signal and the reference voltage, where outputs of the protection controller are coupled to control inputs of the multi-stage CML buffer for operating the multi-stage CML buffer to process the input signal and the reference signal.

In a further embodiment, the multi-stage CML buffer can comprise: a first CML buffer; and a second CML buffer (also referred to as a second stage). The first CML buffer has inputs for receiving the input signal, certain ones of the control signals, and the reference voltage. The second CML buffer has inputs for receiving the input signal, the control signals, the reference voltage, and the outputs from the first CML buffer. The first CML buffer and the second CML buffer can be serially coupled together. If the first CML buffer is activated for processing a received signal(s), then second CML buffer can have a portion activated to pass through the value from the first activated CML buffer. If the first CML buffer is deactivated for processing the received signal(s), then the second CML buffer can be activated to process the received signal(s).

In another embodiment, the first CML buffer can comprise: at least one selection switch for selecting the first CML buffer; and a first current mode logic. The first current mode logic can comprise N-type metal oxide semiconductor ("NMOS") transistors and resistors for providing level shifting of a high common mode voltage. The second CML buffer can comprise: selection switches for selecting a certain one of a plurality of current mode logics; a first current mode logic of the plurality of current mode logics for generating an output based on at least one output of the first CML buffer; and a second current mode logic of the plurality of current mode logics for generating an output based on the input signal and the reference voltage.

Even more so, the first current mode logic can comprise N-type metal oxide semiconductor transistors for providing level shifting of a high common mode voltage and the second current mode logic comprises P-type metal oxide semiconductor ("PMOS") transistors for providing level shifting of a low common mode voltage.

In yet another embodiment, a receiver can further comprise an amplifier. An output of the multi-stage CML buffer can be coupled to an input of the amplifier for outputting at least one amplified output signal.

In an additional embodiment, the receiver receives a differential input signal. The multi-stage CML buffer can have a first input and a second input for coupling to the differential signal. A third input of the multi-stage CML buffer can be coupled to a reference voltage. The first input, the second input, and the third input of the multi-stage CML buffer can be further coupled to each stage of the multi-stage CML buffer.

In another embodiment, the receiver receives a single-ended input signal. The multi-stage CML buffer can have a first input for coupling to the single-ended signal. The multi-stage CML buffer has a second input and a third input coupled to the reference voltage. The first input, the second input, and the third input of the multi-stage CML buffer can be coupled to each stage of the multi-stage CML buffer.

In yet further embodiment, a method for receiving at least one input signal by a receiver is proposed that can comprise the steps of: generating a reference voltage according to a protocol for the input signal; generating a predefined voltage; comparing the predefined voltage and the reference voltage; generating control signals to operate a multi-stage current mode logic buffer based on the compared predefined voltage and reference voltage; operating the multi-stage CML buffer based on the generated control signals; and processing the input signal and the reference signal by the operated multi-stage CML buffer.

Even more so, the method for receiving the input signal and the reference voltage by a receiver can further comprise the step, after the processing step, of amplifying the processed input signal.

In yet additional embodiment, in the generating control signals step, if the reference voltage is equal to or above the predefined voltage, then the generated control signals are used to select a high common mode voltage operation. Alternatively, if the reference voltage is below the predefined voltage, then the generated control signals are used to select a low common mode voltage operation.

Furthermore, in the operating the multi-stage CML buffer step, if the input signal is a differential signal, then the differential signal and the reference signal are inputted to each stage of the multi-stage CML buffer.

In yet another embodiment, in the operating the multi-stage CML buffer step, if the input signal is a single ended line signal, then the single ended line signal and the reference signal are inputted to each stage of the multi-stage CML buffer. The reference signal can be inputted to a pin for the negative differential input IN of the multi-stage CML buffer.

In another embodiment, a DDR receiver for receiving at least one input signal is proposed that can comprise: a comparator for comparing a reference voltage and a predefined voltage; a protection controller, where at least one output of the comparator is coupled to at least one input of the protection controller; and a two-stage current mode logic buffer. The two-stage CML buffer can further comprise: a first CML buffer; and a second CML buffer. The first CML buffer has inputs for receiving the input signal and the reference voltage and the second CML buffer can also have inputs for receiving the input signal and the reference voltage. The first CML buffer and the second CML buffer can be serially coupled together. Outputs of the protection controller are coupled to control inputs of the two-stage CML buffer for operating the two-stage CML buffer to process the input signal and the reference signal.

The first CML buffer can comprise: at least one selection switch for selecting the first CML buffer; and a first current mode logic having N-type metal oxide semiconductor transistors and resistors for providing level shifting of a high common mode voltage. The second CML buffer can comprise selection switches for selecting a certain one of a plurality of current mode logics; a first current mode logic of the plurality of current mode logics for generating an output based on the at least one output of the first CML buffer; and a second current mode logic of the plurality of current mode logics for generating an output based on the input signal and the reference voltage. The first current mode logic can comprise NMOS transistors for providing level shifting of a high common mode voltage, and the second current mode logic can comprise P-type metal oxide semiconductor transistors for providing level shifting of a low common mode voltage.

In an embodiment, the DDR receiver can further comprise an amplifier. The output of the two-stage CML buffer can be coupled to an input of the amplifier for outputting by the amplifier of an amplified data signal.

In yet another embodiment, the DDR receiver can have a differential input signal. The two-stage CML buffer can have a first input and a second input for coupling to the differential signal. The two-stage CML buffer can also have a third input coupled to the reference voltage. The first input, the second input, and the third input of the two-stage CML buffer can be coupled to each of the first CML buffer and the second CML buffer.

In an additional embodiment, the DDR receiver can have a single-ended input signal. The two-stage CML buffer can have a first input for coupling to the single-ended signal. The two-stage CML buffer has a second input and a third input coupled to the reference voltage. The first input, the second input and the third input of the two-stage CML buffer can be coupled to each of the first CML buffer and the second CML buffer.

Figure 2:
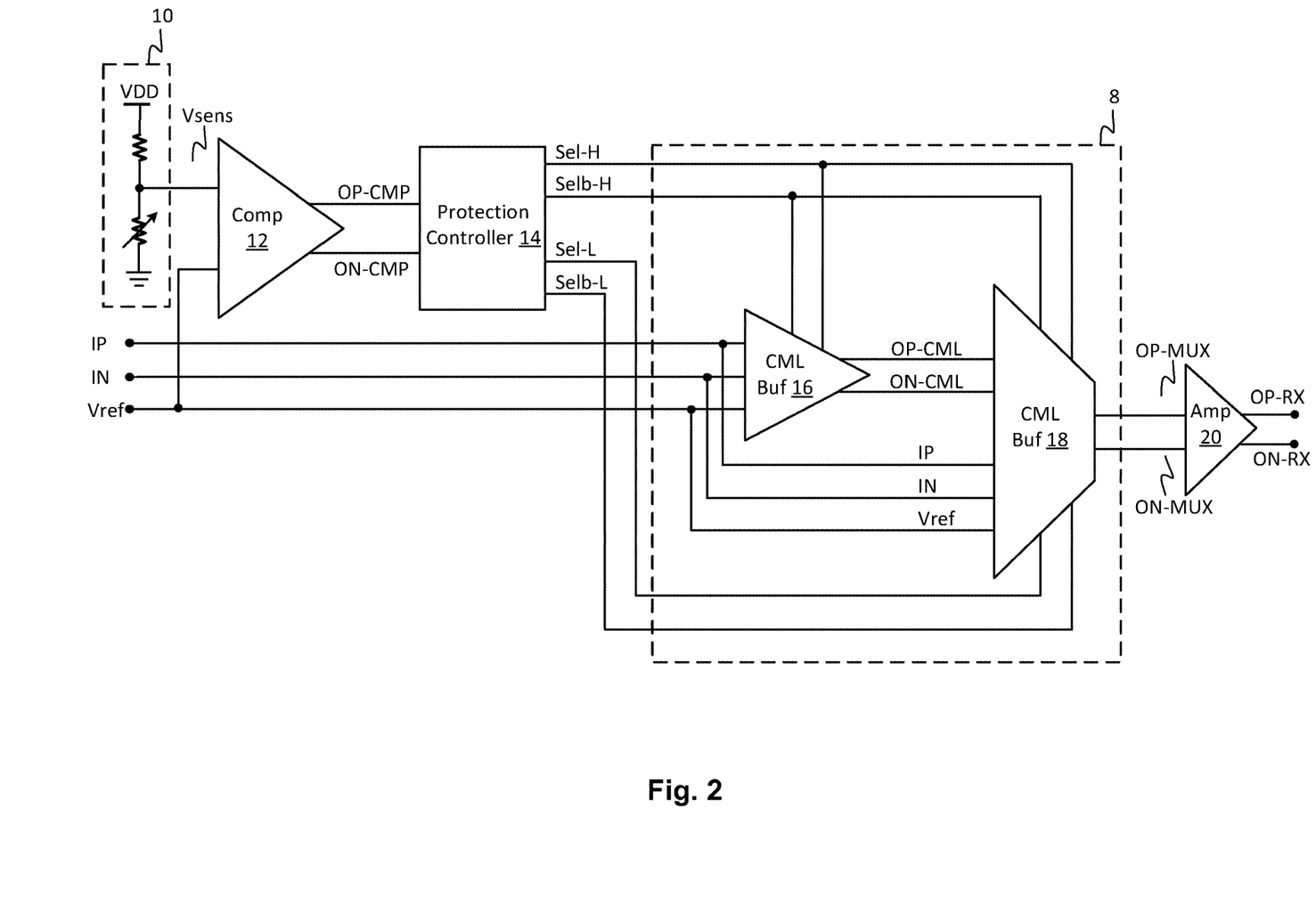
FIG. 2 illustrates a diagram of a multiprotocol receiver of the present disclosure.

FIG. 2 illustrates a diagram of a multiprotocol receiver of the present disclosure. A multi-protocol receiver of the present disclosure comprises a comparator 12, a protection circuit 14, a multi-stage CML buffer 8, and an amplifier 20. In this embodiment, the multi-stage CML buffer 8 has two stages, CML buffer 16 and CML buffer 18. It is understood that other stages can be included based on the design of the multi-stage CML buffer in accordance with the present disclosure. To aid in the understanding of the present disclosure, such additional stages are omitted. However, the disclosure is meant to include such additional stages as well for the multi-stage CML buffer. It can be further appreciated that the amplifier 20 is an optional element of the multi-protocol receiver.

The multi-protocol receiver can have input pins for receiving input signals IP and IN and a reference voltage Vref. In particular, a first pin can be used to receive a signal IP, a second pin can be used to receive a signal IN, and a third pin can be used to receive the reference voltage Vref. If the receiver receives a differential signal as input, then differential signal is applied to the first and second pins accordingly. If the receiver receives a single-ended signal, then the single-ended signal can be applied to the first pin. In such case for a single-ended signal, the reference voltage can be applied to the second and third pins.

The comparator 12 compares the reference voltage Vref and a programmed voltage Vsens. The programmed voltage can be set to a certain voltage to indicate whether the multi-stage buffer 8 should be set to handle a high common mode voltage or a low common mode voltage. For instance, the programmed voltage Vsens can be programmed to be about 50% of a rail voltage Vdd. If the reference voltage is equal to or above that programmed voltage Vsens, then the receiver can be set to handle a high common mode voltage. If the reference voltage is below the programmed voltage Vsens, then the receiver can be set to handle a low common mode voltage. It can be appreciated that the programmed voltage Vsens can be programmed to various voltages to determine how to operate the receiver and/or to determine a high common mode voltage from a low common mode voltage.

In an example, the programmed voltage Vsens can be programmed by a programmable voltage generator 10, which can comprise a resistor and a programmable resistor serially connected across the rail voltage VDD and ground (or other logic low level). In this manner, the programmable resistor can be adjusted to provide a predefined voltage amount for output as the programmed voltage Vsens. It can be appreciated that other methods and circuits can be used for generating a predefined voltage. The programable voltage generator disclosed herein is merely an example of such and is in no way meant to limit the present disclosure to such example.

Once the comparator determines whether or not the reference voltage is less than the programmed voltage Vsens, the comparator outputs a differential signal (or single signal) OP-CMP and ON-CMP to the protection controller 14 to indicate the results of that determination. The protection controller 14 can output control signals for selecting of current mode logics in the multi-stage CML buffer. Differential control signals Sel-H and Selb-H can be used to activate or deactivate current mode logics designed to handle high common mode voltages, and differential controls signal Sel-L and Selb-L can be used to activate or deactivate current mode logics designed to handle low common mode voltages.

The protection circuit 14 can comprise logic gates (not shown) for outputting the controls signals for activating or deactivating CML logics of the multi-stage CML buffer based on the comparator output(s). For instance, if the comparator's output signals indicate that a high common mode voltage mode is detected, then the logic gates of the protection circuit 14 should output a logic high level for the control signal Sel-H and a logic low level for the control signal Selb-H. In turn, the multi-stage CML buffer activates the first stage of the multi-stage CML buffer for processing of the received input signal(s) based on the control signals Sel-H and Selb-H. It can be appreciated that such logic gates and/or other components can be used to implement the functionality of the protection circuit 14. Such designs for a protection circuit are apparent and understood based on the present disclosure. For instance, in yet another example, the protection circuit 14 can comprise transistors switches for implementing a digital multiplexer for selecting various logics and/or stages in the multi-stage CML buffer.

The control signals Sel-H, Selb-H, Sel-L, and Selb-L are inputted to the multi-stage CML buffer 8 for selecting which CMLs and/or stages to use for processing of the input signal(s). The input signal(s) and the reference voltage Vref are inputted to each stage of the multi-stage CML buffer 8. The multi-stage CML buffer 8 comprises a first CML buffer 16 (also referred to as a first stage of the multi-stage CML buffer) and a second CML buffer 18 (also referred to as a second stage of the multi-stage CML buffer). The first CML buffer 16 and the second CML buffer 18 are serially connected. The output of the second CML buffer 18 can be differential signals OP-MUX and ON-MUX that are coupled to inputs of the amplifier 20.

The amplifier receives the differential signals OP-MUX and ON-MUX and outputs amplified differential signals OP-RX and ON-RX. It can be appreciated that the differential signaling used by the multi-stage CML buffer 8 and the amplifier 20 can be also implemented as a single line signal. Thu, in other embodiments, the multi-stage CML buffer 8 and the amplifier 20 can also include using single-ended signaling schemes to implement the CML buffer 8 and the amplifier 20. It can be appreciated that such variations in the receiver are within the scope of the present disclosure.

Operationally, input data coming from a channel to the multi-protocol receiver can have low or high DC common mode voltage depending on a termination method used in the respective transmission protocol. The multi-protocol receiver can process both low and high DC common mode voltages and can support a rail-to-rail input DC common mode voltage.

To support a rail-to-rail DC voltage range, a comparator can be used to determine whether a received signal(s) will be processed in a mode for handling a low common mode voltage or a high common mode voltage. The comparator compares a programmed voltage Vsens with a reference voltage Vref. The comparator then generates differential signals OP-CMP and ON-CMP that are indicative of the comparison. The protection circuit can use the output signals from the comparator to determine whether to operate the receiver in a high input DC common mode voltage or a low input DC common mode voltage.

If the receiver is operated in a high input DC common mode voltage, the reference voltage Vref is higher than the programmed voltage Vsens or equal to the programmed voltage Vsens. Therefore, the received input signal(s) can be applied to an NMOS-based logic block of the multi-stage CML buffer.

Otherwise, the received input signal(s) can be applied to a PMOS-based logic block of the multi-stage CML buffer (e.g., the second CML buffer can be chosen for processing a low DC common mode voltage or passing on values of a previous stage of the multi-stage CML buffer).

The comparator can output the differential signals OP-CMP and ON-CMP to the protection controller, which further generates each of the control signals for operating the multi-stage CML buffer. The protection circuit generates control signals Sel-H, Selb-H, Sel-L, and Selb-L for operating the multi-stage CML buffer based on the comparator's output(s). The protection circuit may have control ("CTRL") input pins (not shown) to further allow it to be programmable to determine which control signal settings correspond to which operating mode of the multi-stage CML buffer.

The multi-protocol receiver can support both differential and single-ended signaling. If differential signaling is used, input pins for the signals IP and IN are coupled to the differential signals accordingly. Otherwise, the pin of the receiver for the signal IN is connected to the reference voltage Vref signal to use for a single-ended signaling protocol. Pins for the input signals IP and IN and for the reference voltage Vref are coupled to each stage of the multi-stage CML buffer.

Figure 3:
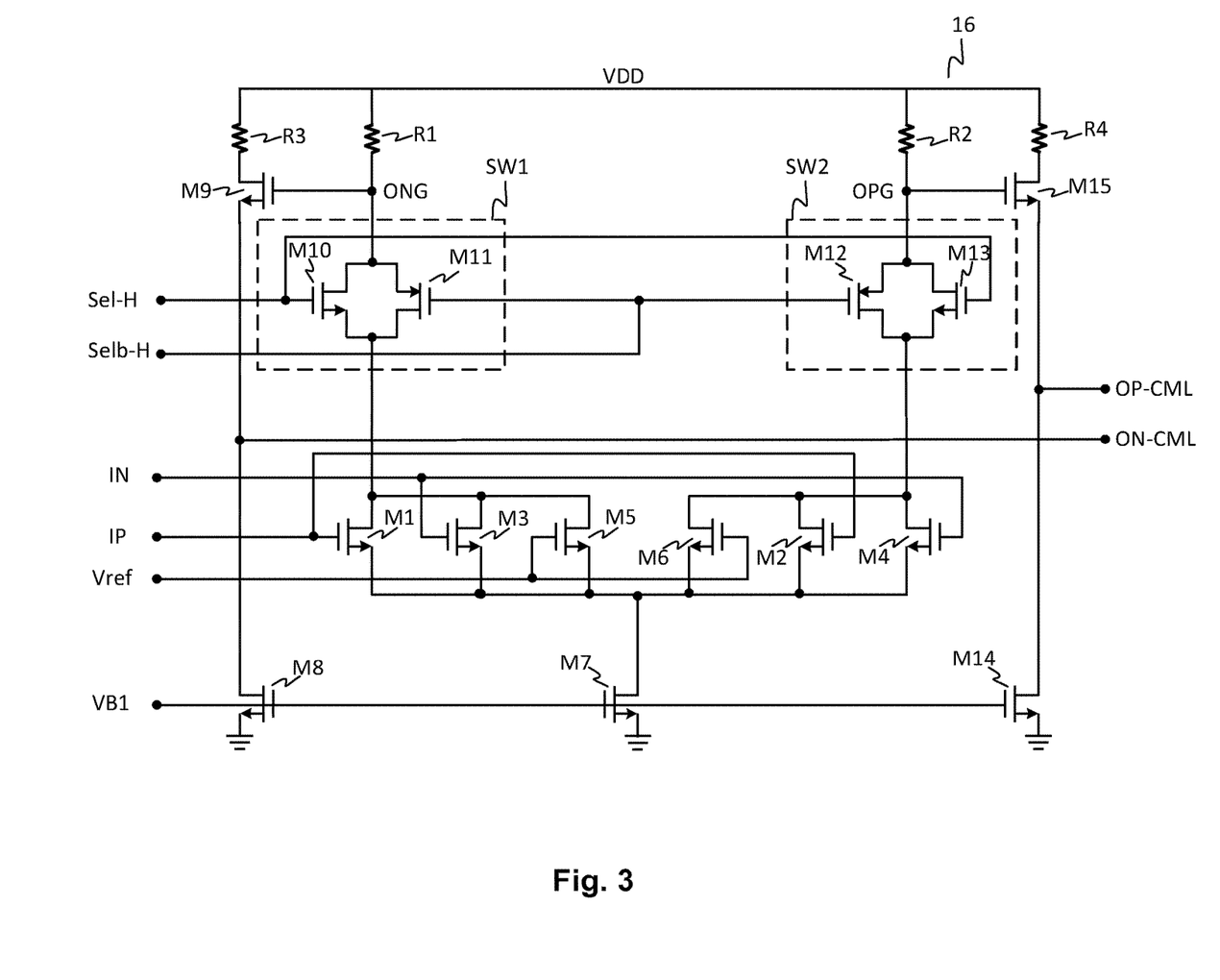
FIG. 3 illustrates a circuit diagram of a first stage of a two-stage current mode logic buffer of the present disclosure.

FIG. 3 illustrates a circuit diagram of a first stage of a two-stage current mode logic buffer of the present disclosure. The first CML buffer 16 (also the first stage of the two-stage CML buffer) can comprise switches SW1 and SW2, NMOS transistors M1-M9 and M14-M15, and resistors R1-R4. The NMOS transistors M1-M9 and M14-M15 and the resistors R1-R4 form a current mode logic for handling high common mode voltages. Thus, the first CML buffer 16 can be applicable for high input DC common mode voltage since NMOS transistors in general may need a DC voltage larger than its threshold voltage to be on.

The switches SW1 and SW2 can be used to active or deactivate the current mode logic formed by NMOS transistors M1-M9 and M14-M15 and the resistors R1-R4. For instance, when the control signal Sel-H is at a logic high level and Selb-H is at a logic low level, switches SW1 and SW2 are turned on connecting the transistors M1-M6 to nodes ONG and OPG. The first CML buffer 16 is effectively activated to process the signals IN, IP, and Vref.

When the control signal Sel-H is at a logic low level and Selb-H is at a logic high level, switches SW1 and SW2 are turned off, thereby disconnecting the transistors M1-M6 from nodes ONG and OPG. The first CML buffer 16 can be effectively deactivated and not used for processing any of the signals IN, IP, and Vref.

The transistors M1, M3, and M5 are connected in parallel with one end of the parallel connection connected to the switch SW1 and another end of the parallel connection connected to the transistor M7. The gate of the transistor M1 is coupled to the signal IP; the gate of the transistor M3 is coupled to the signal IN; and the gate of the transistor M5 is coupled to the reference voltage Vref. In situations where a singled ended signal is received by the receiver, the reference voltage Vref is used as signal IN for the first CML buffer 16. For instance, the pin for signal IN can be coupled to the reference voltage externally or internally using a switch (not shown). In this manner, the first CML buffer 16 can handle differential signals as well as a single ended signal.

Also, the transistor M1 has a feature size that is larger than transistors M3 and M5 such that the transistor M1 is the dominant circuit element. For instance, transistor M1 can have a feature size five times greater than each of the transistors M3 and M5. The feature size of the transistor M3 can equal the feature size of the transistor M5. Furthermore, the feature size of M1 can equal the feature size of the transistor M4. The transistors M3 and M5 are used to reduce gate bias stress effect and can be optional circuit elements.

Generally, the carrier channel is created in MOSFET transistors by applying a gate-source voltage. When the voltage applied to the gate of a MOSFET transistor is larger than the threshold voltage of the transistor, the carrier channel can be created between drain and source nodes to allow for current flow. The threshold voltage of the transistor can change over time due to bias stress effects. When a positive gate bias stress is applied to the transistor, the current decreases and the threshold voltage is shifted in the positive gate bias direction. Also, the threshold voltage is shifted in the negative gate bias direction if a negative gate bias stress is applied. This bias stress effect can be boosted over time or a slower sweep rate of the gate bias is applied to the transistor.

A bias voltage VB1 can be applied on the gates of the transistors M8, M7, and M14. It can be appreciated that, in order to bias a transistor, a DC voltage should be higher than a threshold voltage for an NMOS transistor. For example, the bias voltage VB1 can be 0.6V. The bias voltage VB1 can be generated by a current mirror or a DC voltage generator. It can be apparent that the bias voltage can range depending on the type of transistor to bias. Such ranges are apparent to one having ordinary skill in the art. It is important to note that the bias voltages described herein and methods for generating them are not to be limited to the embodiments described since there are other equivalent circuits known in the art.

The resistor R1, the gate of M9, and the switch SW1 are connected to the node ONG. When the switch SW1 is on, the transistor M1 inverts the signal IP. The inverted signal is applied to the gate of transistor M9 via the node ONG. The transistor M9 acts as a voltage follower to translate the inverter voltage for output as a signal ON-CML. The resistor R3 and the transistors M9 and M8 are serially connected. The resistors R1 and R2 can determine an output DC common mode voltage for the first stage of the multi-stage CML buffer. The DC voltage applied on gates of the transistors M9 and M15 are determined by current through the resistors R1 and R2.

The other side of the first CML buffer 16 is connected in a symmetrical manner as follows. The transistors M4, M2, and M6 are connected in parallel with one end of the parallel connection connected to the switch SW2 and another end of the parallel connection connected to the transistor M7. The gate of the transistor M4 is coupled to the signal IN; the gate of the transistor M2 is coupled to the signal IP; and the gate of the transistor M6 is coupled to the reference voltage Vref. In situations where a singled ended signal is received by the receiver, the reference voltage Vref is used as the signal IN for the first CML buffer 16. In this manner, the first CML buffer 16 can handle differential signaling as well as a single ended signal.

Also, the transistor M4 has a feature size that is larger than the transistors M2 and M6 such that the transistor M4 is the dominant circuit element. For instance, transistor M4 can have a feature size five times greater than each of the transistors M2 and M6. The feature size of the transistor M2 can equal the feature size of the transistor M6. The transistors M2 and M6 can aid to reduce gate bias stress effect and are optional circuit elements. Furthermore, other feature size multipliers can be used in accordance of the present disclosure to maintain the dominance by transistor M4 and are within the scope of the present disclosure.

The resistor R2, the gate of M15, and the switch SW2 are connected to the node OPG. When the switch SW2 is on, the transistor M4 inverts the signal IN. The inverted signal is applied to the gate of transistor M15 via the node OPG. The transistor M15 acts as a voltage follower to translate the inverter voltage for output as a signal OP-CML. The resistor R4 and the transistors M15 and M14 are serially connected.

The combination of the transistor M9 and the resistor R3 (as well as the combination of the transistor M15 and the resistor R4) can act as a level shifter. DC common mode voltages generated at the nodes OPG and ONG can be higher than a threshold voltage for the PMOS transistors of the second CML buffer, so this DC voltage is shifted down by using a level shifter to reach a required low-level value to bias the PMOS transistors in the next stage of the multi-stage CML buffer.

Figure 4:
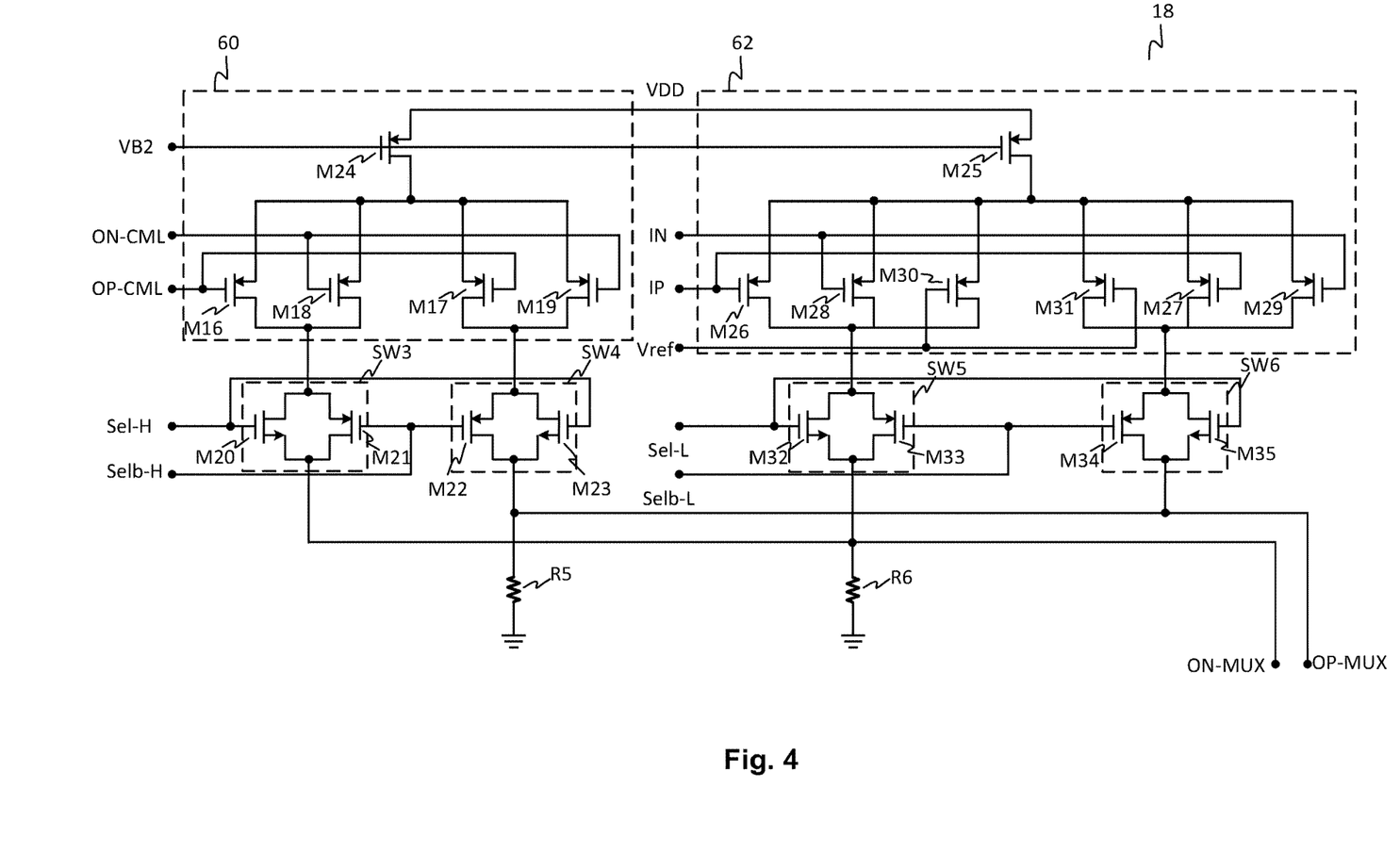
FIG. 4 illustrates a circuit diagram of a second stage of a two-stage current mode logic buffer of the present disclosure.

FIG. 4 illustrates a circuit diagram of a second stage of a two-stage current mode logic buffer of the present disclosure. The second CML buffer 18 can provide a multiplexer functionality and two current mode logics. For instance, the second CML buffer 18 uses switches SW3-SW6 to select one of the logic blocks 60 or 62. The logic block 60 receives differential signals ON-CML and OP-CML from the first CML buffer 16 and generates the differential signals ON-MUX and OP-MUX. The logic block 62 receives the input signals IN, IP, and Vref and processes those signals using PMOS transistors, which are more suitable for low common mode voltages. The switches SW3-SW6 are operated by the protection controller 14 to activate one of the logic blocks 60 and 62, depending on the voltage range of the input signal to the respective receiver. The resistors R5 and R6 can be used for generating outputs ON-MUX and -OP-MUX and can be optional element depending on the design of the receiver and/or respective CML buffer. The resistors R5 and R6 can be used to determine an output DC common mode voltage for the input transistors of the amplifier block.

The logic block 60 serves to pass on the generated signals from the CML buffer 16. The logic block 60 comprises PMOS transistors M16-M19 and M24. The switches SW3 and SW4 can be used to active or deactivate the logic block 60. For instance, when the control signal Sel-H is at a logic high level and Selb-H is at a logic low level, switches SW3 and SW4 are turned on connecting the transistors M16-M19 to output nodes for ON-MUX and OP-MUX. The logic block 60 can provide a pass through for signals received from the first CML buffer 16.

When the control signal Sel-H is at a logic low level and Selb-H is at a logic high level, switches SW3 and SW4 are turned off, thereby disconnecting the transistors M16-M19 from the output nodes for ON-MUX and OP-MUX. The logic block 60 is effectively deactivated and not used for processing of the received signal of the receiver.

The transistors M16 and M18 are connected in parallel with one end of the parallel connection connected to the switch SW3 and another end of the parallel connection connected to the transistor M24. The gate of the transistor M16 is coupled to the signal OP-CML; and the gate of the transistor M18 is coupled to the signal ON-CML. Also, the transistor M16 has a feature size that is larger than the transistor M18 such that the transistor M16 is the dominant circuit element. For instance, transistor M16 can have a feature size five times greater than the transistor M18's feature size. The transistor M18 is an optional circuit element used to reduce gate bias stress effect.

A bias voltage VB2 can be applied on the gates of the transistors M24 and M25. The bias voltage VB2 can be generated by a current mirror or a DC voltage generator and can have a value of about 0.3V to bias the PMOS transistors. It can be apparent that the bias voltage can range depending on the type of transistor to bias. Such ranges are apparent to one having ordinary skill in the art. It is important to note that the bias voltages described herein and methods for generating them are not limited to the embodiments described herein since there are other equivalent circuits known in the art.

The resistor R6 and the switch SW3 are connected to the output node for ON-MUX. When the switch SW3 is on, the transistor M16 inverts the signal OP-CML. The inverted signal can then be outputted for providing the signal ON-MUX.

The transistors M17 and M19 are connected in parallel with one end of the parallel connection connected to the switch SW4 and another end of the parallel connection connected to the transistor M24. The gate of the transistor M19 is coupled to the signal ON-CML; and the gate of the transistor M17 is coupled to the signal OP-CML. Also, the transistor M19 has a feature size that is larger than the transistor M17 such that the transistor M19 is the dominant circuit element. For instance, transistor M19 can have a feature size five times greater than the transistor M17's feature size. The transistor M17 is an optional circuit element used to reduce gate bias stress effect.

The resistor R5 and the switch SW4 are connected via the output node for OP-MUX. When the switch SW4 is on, the transistor M19 inverts the signal ON-CML. The inverted signal can then be outputted for providing the signal OP-MUX. The resistors R5 and R6 can determine an output DC common mode voltage of the second CML buffer. For instance, the output DC voltage can be determined by current through the resistors R5 and R6.

If it is determined that the received signal for the receiver has a low common mode voltage, then the logic block 62 can be activated for processing the received signal. In such case, the logic block 60 is deactivated and the first CML buffer 16 is deactivated as well.

The logic block 62 comprises PMOS transistors M25-M31. The switches SW5 and SW6 can be used to active or deactivate the logic block 62. For instance, when the control signal Sel-L is at a logic high level and Selb-L is at a logic low level, the switches SW5 and SW6 are turned on connecting the transistors M26-M31 to output nodes for ON-MUX and OP-MUX.

When the control signal Sel-L is at a logic low level and Selb-L is at a logic high level, switches SW5 and SW6 are turned off, thereby disconnecting the transistors M26-M31 from the output nodes for the signal ON-MUX and OP-MUX. The logic block 62 is effectively deactivated and not used for processing the received signal of the receiver.

The transistors M26, M28, and M30 are connected in parallel with one end of the parallel connection connected to the switch SW5 and another end of the parallel connection connected to the transistor M25. The gate of the transistor M26 is coupled to the signal IP; the gate of the transistor M28 is coupled to the signal IN; and the gate of the transistor M30 is coupled to the reference voltage Vref. In situations where a singled ended signal is received by the receiver, the reference voltage Vref is used as a signal IN by connecting the reference voltage to the input pin of the receiver for the signal IN. In this manner, the second CML buffer 18 can handle differential signals as well as single ended signal.

Also, the transistor M26 has a feature size that is larger than transistors M28 and M30 such that the transistor M26 is the dominant circuit element. For instance, transistor M26 can have a feature size five times greater than each of the transistors M28 and M30. The transistors M28 and M30 can aid to reduce gate bias stress effect of transistors and are optional circuit elements.

The resistor R6 and the switch SW5 are connected to the node for the signal ON-MUX. When the switch SW5 is on, the transistor M26 inverts the signal IP. The inverted signal is outputted as the signal ON-MUX.

The other side of the logic 62 is connected in a symmetrical manner as follows. The transistors M29, M27, and M31 are connected in parallel with one end of the parallel connection connected to the switch SW6 and another end of the parallel connection connected to the transistor M25. The gate of the transistor M29 is coupled to the signal IN; the gate of the transistor M27 is coupled to the signal IP; and the gate of the transistor M31 is coupled to the reference voltage Vref. In situations where a singled ended signal is received by the receiver, the reference voltage Vref is used as a signal IN by applying the reference voltage Vref to an input pin of the receiver for the signal IN. In this manner, the second CML buffer 18 can handle differential signals as well as single ended signal.

Also, the transistor M29 has a feature size that is larger than transistors M27 and M31 such that the transistor M29 is the dominant circuit element. For instance, transistor M29 can have a feature size five times greater than each of the transistors M27 and M31. The transistors M27 and M31 can aid to reduce gate bias stress effect and are optional circuit elements. Furthermore, other feature size multipliers can be used in accordance of the present disclosure to maintain the dominance by transistor M29 and are within the scope of the present disclosure.

Figure 5:
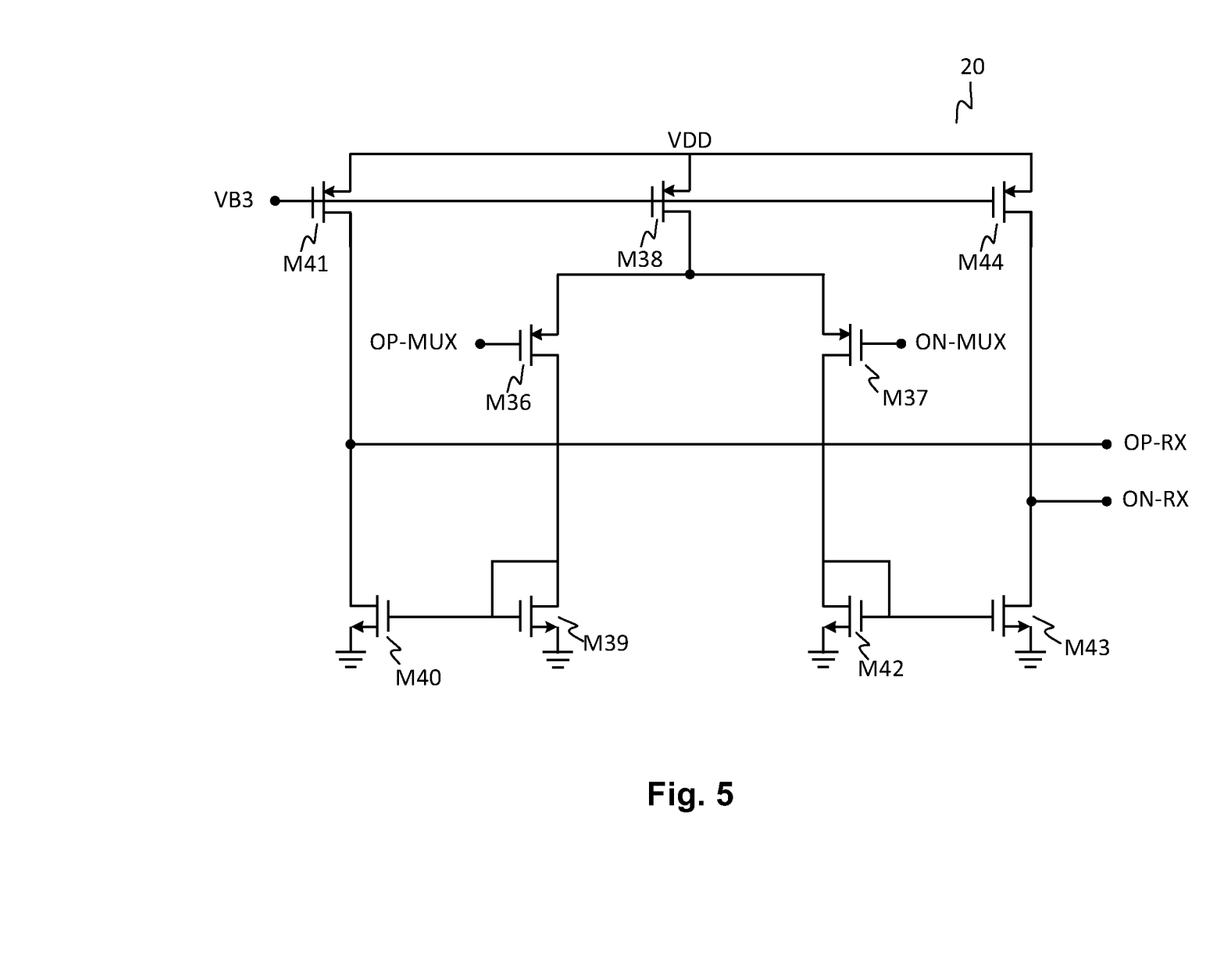
FIG. 5 illustrates a circuit diagram of an amplifier.

The resistor R5 and the switch SW6 are connected to the node for the signal OP_MUX. When the switch SW6 is on, the transistor M29 inverts the signal IN for output at the node for the signal OP_MUX FIG. 5 illustrates a circuit diagram of an amplifier. An amplifier comprises NMOS transistors M39, M40, M42, and M43 and PMOS transistors M36-M38, M41, and M44. The transistors M41, M38 and M44 are biased by a bias voltage VB3. The bias voltage VB3 can also be generated by a current mirror or a DC voltage generator and can be about 0.3V for PMOS transistors. It can be apparent that the bias voltage can range depending on the type of transistor to bias. Such ranges are apparent to one having ordinary skill in the art. It is important to note that the bias voltages described herein and methods for generating them are not to be limited to the embodiments described herein since there are other equivalent circuits known in the art. The gate of the transistor M36 is coupled to the signal OP-MUX to amplify that signal to generate the OP-RX amplified signal. Likewise, the gate of the transistor M37 is coupled to the signal ON-MUX to amplify that signal to generate the ON-RX signal.

Operationally, the amplifier is a common differential amplifier used for amplifying the multi-stage CML buffer's output signals OP-MUX and ON-MUX. The amplifier can have a DC gain, $g_m r_o$, where $g_m$ is a current transconductance of the transistor M37 and $r_o$ is an output resistance of the transistors M43 and M44, assuming the transistors have the same or about the same feature size. The current generated by the transistor M38 can go through source terminals of the transistors M36 and M37. A current mirror formed by the transistors M39 and M40 (and similarly by the transistors M42 and M43 for the node ON-RX) mirror the current to the output node for OP-RX. Thus, the amplified signal OP-RX and ON-RX are differential.

It can be appreciated that the amplifier is an optional element depending on the design of the respective receiver and/or the design of a respective device/system in which the receiver is disposed. It can be further appreciated other amplifier devices are well known in the art and can be used in conjunction of the present disclosure. The amplifier disclosed herein is not meant to limit the present disclosure in any way.

Figure 6:
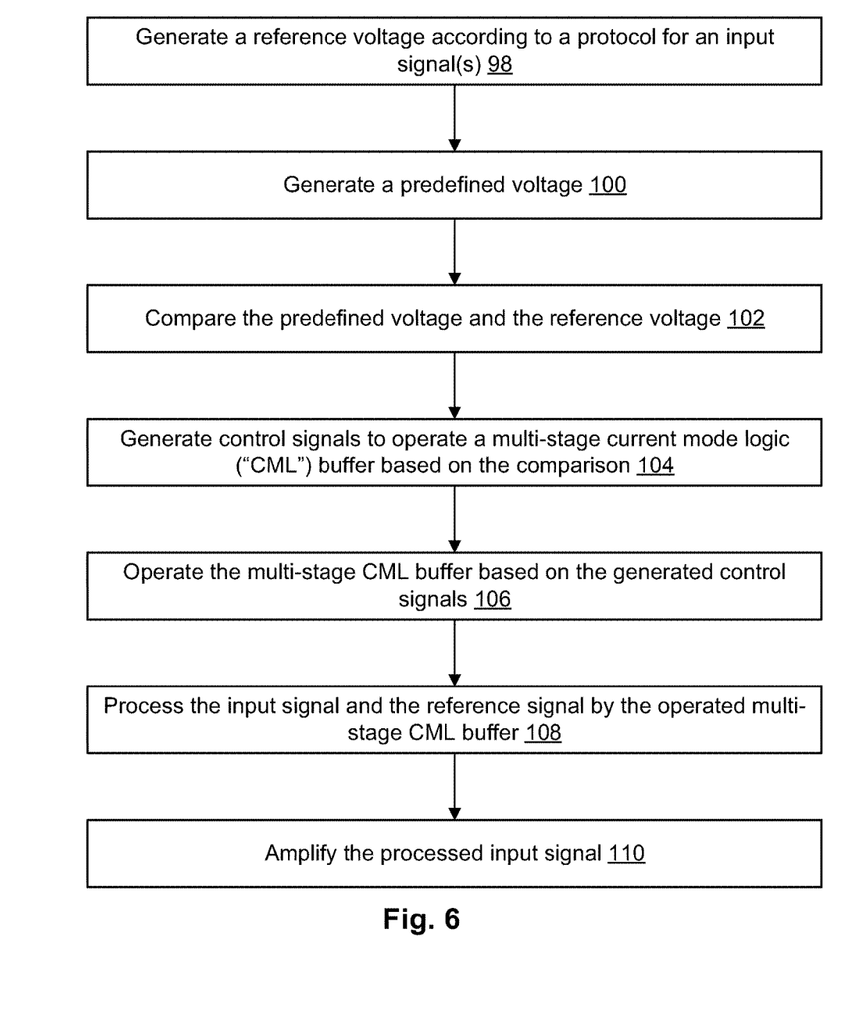
FIG. 6 illustrates a flow chart for operating a receiver of the present disclosure.

FIG. 6 illustrates a flow chart for operating a receiver of the present disclosure. A multi-protocol receiver of the present disclosure can be operated in the following manner. A reference voltage is generated in accordance with a protocol for the received signal(s), step 98. A predefined voltage, Vsens, (also referred to as a voltage sense threshold or voltage sense) can be generated, step 100. A programmable voltage generator can be used to generate a predefined voltage to be used as a predefined voltage. A comparator can then be used to compare the predefined voltage and the reference voltage, step 102. Next, control signals can be generated, step 104, to operate a multi-stage current mode logic buffer based on the comparison by the comparator. The control signals can be generated internally by a receiver using a protection controller or other similar circuit or logic. Alternatively, the comparator's comparison result can be outputted to an external logic, where the external controls can operate the multi-stage CML buffer.

The multi-stage CML buffer is then operated based on the generated control signals, step 106. The input signal and a reference signal for the input signal can then be processed accordingly by the multi-stage CML buffer, step 108. Lastly, the output of the multi-stage CML buffer can be amplified by an amplifier, step 110.

It can be appreciated that the order of steps disclosed herein are one sampling of the order which can be taken for processing a signal by a multi-protocol receiver. It can be understood that the ordering of the steps can be altered within the spirit of the present disclosure. Furthermore, the steps can be also condensed into fewer blocks/steps or expanded into additional blocks/steps. Such minor alterations are within the scope of the present disclosure.

It can also be appreciated that the present disclosure can be used for a receiver or a transceiver for DDR memory interfaces. For instance, referring to the receiver illustrated in FIG. 2, the receiver can be operated to handle various DDR protocols as outlined in Table 1 below:

TABLE 1

| Protocol | Vsens | Vref | Sel-H | Selb-H | Sel-L | Selb-L | SW1 &SW2 | SW3 &SW4 | SW5 &SW6 | NMOS CML | PMOS CML |
|---|---|---|---|---|---|---|---|---|---|---|---|
| DDR3 | VDD/3 | VDD * 50% | H | L | L | H | Active | Active | De-active | active | De-active |
| DDR4 | VDD/2 | VDD * 80% | H | L | L | H | Active | Active | De-active | active | De-active |

TABLE 1-continued

| Protocol | Vsens | Vref | Sel-H | Selb-H | Sel-L | Selb-L | SW1 &SW2 | SW3 &SW4 | SW5 &SW6 | NMOS CML | PMOS CML |
|---|---|---|---|---|---|---|---|---|---|---|---|
| LPDDR3 | VDD/2 | VDD * 80% | H | L | L | H | Active | Active | De-active | active | De-active |
| LPDDR4 | VDD/2 | VDD * 20% | L | H | H | L | De-active | De-active | Active | De-active | active |
| LPDDR4x | VDD/2 | VDD * 20% | L | H | H | L | De-active | De-active | Active | De-active | active |

As an example under the DDR3 protocol, a predefined voltage Vsens can be programmed to be about a third of a rail voltage VDD. A reference voltage can be generated to be about half the value of the rail voltage VDD. As such, the receiver is operated in a high common mode voltage setting since the reference voltage Vref is greater than the predefined voltage Vsens. As such, the control signal Sel-H is set to a logic high level, the control signal Selb-H is set to a logic low level, the control signal Sel-L is set to a logic low level, and the control signal Selb-L is set to a logic high level.

The control signals can then in turn activate the switches SW1-SW4 in the multi-stage CML buffer and deactivate the switches SW5 and SW6. The activated switches can then activate the NMOS-based current mode logic and the deactivated switches can deactivate the PMOS-based current mode logic.

Likewise, Table 1 illustrates how a receiver of the present disclosure can be used to operate various DDR protocols, including DDR4, low power DDR3 ("LPDDR3"), low power DDR ("LPDDR4"), and future generations of low power DDR ("LPDDR4x").

Furthermore, it's understood the present application is generally applicable for any application in which a receiver or transceiver is used in a single-ended signaling protocol or a differential signaling protocol.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A multi-protocol receiver for receiving one or more input signals comprising:
   a comparator for comparing a reference voltage and a predefined voltage to determine a common mode voltage;
   a protection controller coupled to the comparator, the protection controller configured to generate one or more selection signals based on an output of the comparator;
   a first current mode logic (CML) buffer comprising:
      one or more inputs for receiving the one or more input signals, and
      one or more control inputs for receiving at least a subset of selection signals from the protection controller; and
   a second CML buffer coupled to the first CML, the second CML comprising:
      a first set of inputs for receiving the one or more input signals,
      a second set of inputs for receiving one or more output signals from the first CML buffer, and
      one or more control inputs for receiving at least a subset of selection signals from the protection controller;
   wherein the selection signals are configured to select the first CML buffer or the second CML buffer to process the one or more input signals based on the determined common mode voltage.

2. The multi-protocol receiver of claim 1, wherein the first CML buffer comprises:
   at least one selection switch for selecting the first CML buffer; and
   a first current mode logic.

3. The multi-protocol receiver of claim 2 wherein the first current mode logic comprises N-type metal oxide semiconductor ("NMOS") transistors and resistors for providing level shifting of a high common mode voltage.

4. The multi-protocol receiver of claim 1, wherein the second CML buffer comprises:
   selection switches for selecting a certain one of a plurality of current mode logics;
   a first current mode logic of the plurality of current mode logics for generating an output based on at least one output of the first CML buffer; and
   a second current mode logic of the plurality of current mode logics for generating an output based on at least one of the one or more input signals and the reference voltage.

5. The multi-protocol receiver of claim 4 wherein the first current mode logic comprises N-type metal oxide semiconductor ("NMOS") transistors for providing level shifting of a high common mode voltage and the second current mode logic comprises P-type metal oxide semiconductor ("PMOS") transistors for providing level shifting of a low common mode voltage.

6. The multi-protocol receiver of claim 1 further comprising an amplifier, wherein at least one output of the second CML buffer is coupled to an input of the amplifier for outputting at least one amplified output signal.

7. The multi-protocol receiver of claim 1 wherein the one or more input signals include a differential signal.

8. The multi-protocol receiver of claim 1 wherein the one or more input signals include a single-ended signal.

9. A method for receiving one or more input signals by a receiver, comprising:
   generating a reference voltage according to a protocol for the one or more input signals;
   comparing a predefined voltage and the reference voltage to determine a common mode voltage;
   generating one or more selection signals based on the common mode voltage;
   selecting a first current mode logic (CML) buffer or a second CML buffer based on the one or more selection signals, the first CML buffer or the second CML buffer selected to process one or more input signals based on the determined common mode voltage, the first CML buffer configured to receive the one or more input signals and at least a subset of the one or more selection signals, and the second CML buffer configured to receive the one or more input signals, one or more output signals from the first CML, and at least a subset of the one or more selection signals.

10. The method of claim 9 further comprising:
amplifying the processed one or more input signals.

11. The method of claim 9, further comprising:
responsive to the reference voltage being equal to or above the predefined voltage, selecting a high common mode voltage operation.

12. The method of claim 9, further comprising:
responsive to the reference voltage being below the predefined voltage, selecting a low common mode voltage operation.

13. The method of claim 9, wherein the one or more input signals include a differential signal.

14. The method of claim 9, wherein the one or more input signals include a single-ended signal.

15. A double data rate ("DDR") receiver for receiving at least one input signal comprising:
a comparator for comparing a reference voltage and a predefined voltage to determine a common mode voltage;
a protection controller coupled to the comparator, the protection controller configured to generate one or more selection signals based on an output of the comparator; and
a two-stage current mode logic ("CML") buffer, comprising:
a first CML buffer comprising:
one or more inputs for receiving the one or more input signals, and
one or more control inputs for receiving at least a subset of selection signals from the protection controller; and
a second CML buffer coupled to the first CML, the second CML comprising:
a first set of inputs for receiving the one or more input signals,
a second set of inputs for receiving one or more output signals from the first CML buffer, and
one or more control inputs for receiving at least a subset of selection signals from the protection controller, the selection signals configured to select the first CML buffer or the second CML buffer to process the one or more input signals.

16. The DDR receiver of claim 15,
wherein the first CML buffer further comprises:
at least one selection switch for selecting the first CML buffer; and
a first current mode logic having N-type metal oxide semiconductor ("NMOS") transistors and resistors for providing level shifting of a high common mode voltage,
wherein the second CML buffer further comprises:
selection switches for selecting one of a plurality of current mode logics;
a first current mode logic of the plurality of current mode logics for generating an output based on the one or more output signals of the first CML buffer; and
a second current mode logic of the plurality of current mode logics for generating an output based on the one or more input signals,
wherein the first current mode logic comprises NMOS transistors for providing level shifting of a high common mode voltage, and
wherein the second current mode logic comprises P-type metal oxide semiconductor ("PMOS") transistors for providing level shifting of a low common mode voltage.

17. The DDR receiver of claim 15 further comprising an amplifier, wherein at least one output of the two-stage CML buffer is coupled to an input of the amplifier for outputting at least one amplified output signal.

18. The DDR receiver of claim 15 wherein the one or more input signals include a differential signal.

19. The DDR receiver of claim 15 wherein the one or more input signals include a single-ended signal.

* * * * *